ELECTRONICALLY TUNABLE HIGH FREQUENCY NETWORK USING PIN DIODES

Filed April 30, 1965

INVENTOR
PETER M. TOLLIVER

BY Samuel R. Genca

ATTORNEY

3,414,833
ELECTRONICALLY TUNABLE HIGH FREQUENCY NETWORK USING PIN DIODES

Peter M. Tolliver, Rochester, N.Y., assignor to General Dynamics Corporation, a corporation of Delaware Filed Apr. 30, 1965, Ser. No. 452,121
7 Claims. (Cl. 330—53)

ABSTRACT OF THE DISCLOSURE

A plurality of PIN diodes are disposed laterally between the conductive members of a transmission line or cavity and at spaced positions. A bias control circuit selectively conditions different diodes from reverse to forward biased relationship. Inasmuch as the diodes are within the propagation path of electromagnetic waves, the resonant network presented to an external circuit, such as an amplifier, at the input end of the line can be electronically tuned by the bias control circuit.

The present invention relates generally to ultra-high frequency electronic apparatus and more particularly to an electronically tunable ultra-high frequency power amplifier.

Although the present invention is suited for more general applications such as in pre-selectors or filters, it is particularly adapted for use in an electronically tunable ultra-high frequency power amplifier.

Known ultra-high frequency power amplifiers employ a network including a transmission line which may be tuned or adjusted mechanically to achieve resonance or a desired inductive or capacitive reactance. Although mechanical tuning has worked satisfactorily for the purpose intended, mechanical tuning does present some disadvantages and problems of long standing in the art. For example, mechanical tuning is not readily adaptable for remote control because of the fine adjustments required. Further, mechanical tuning requires a micrometer adjustment which adds to the cost and increases the size and weight of the equipment. Accordingly mechanically tuned power amplifiers may be disadvantageous, particularly in airborne equipment, such as Tacan equipment.

Accordingly, it is an object of the present invention to provide a new and improved electronically tunable ultra-high frequency power amplifier.

It is a general object of the present invention to provide an improved electronically tunable amplifier which is remotely controllable, simple to construct, easy to operate, relatively inexpensive, small in size and light in weight.

It is another object of the present invention to provide an improved programmable wide band amplifier which may have a plurality of overlapping gain response curves to tune over a wide band of frequencies.

It is still another object of the present invention to provide an improved transmission line which may be used to derive a desired inductive or capacitive reactance remotely and electronically.

It is yet another object of the present invention to provide an improved easily packaged unit generally useful as a broad band tuned network in UHF circuits.

Another object of the present invention is to provide an improved tuned network of the type which is well suited for use in a plate load circuit of an ultra-high frequency amplifier.

An embodiment of the present invention which accomplishes the above objects and other objects includes an improved electronically tunable ultra-high frequency power amplifier having a transmission line in its load circuit such as a resonant cavity. The cavity has a center conductor and an outer wall of conducting material. The resonant cavity is electrically in length at least a quarter wavelength at a given operating frequency which may be in the UHF band and has distributed inductance. Further included are a plurality of electronic switching means such as diodes extending radially between the wall and center conductor along the length of the transmission line. These diodes have the characteristic of providing lower impedance than the line at the operating frequency when in their conductive states. Circuit means are provided for selectively biasing the diodes into and out of their conductive states for varying the electrical length of the line to selectively step-tune the amplifier.

The invention itself, both as to its organization and method of operation, as well as additional objects and advantages thereof will become more readily apparent from a reading of the following description in connection with the accompanying drawings in which.

Figures 1, 2, 3, 4, 5:
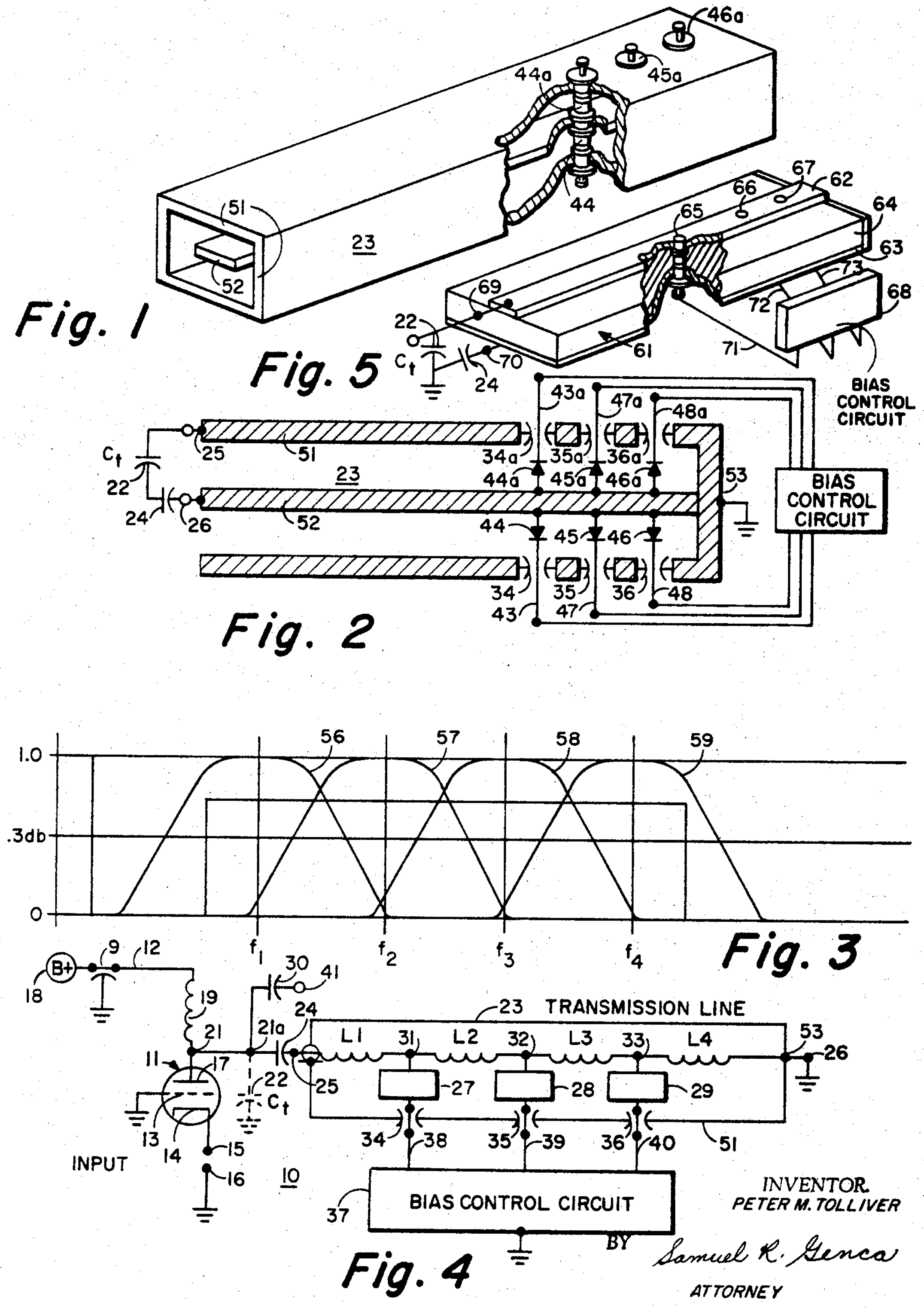
FIG. 1 illustrates a transmission line of the triplate type in perspective view, partly cut away to show details thereof, all in accordance with the invention.
FIG. 2 is a schematic diagram of a circuit embodying the invention, the diagram including a cross-sectional view of the transmission line of FIG. 1.
FIG. 3 is a graph illustrating the operating characteristics of an amplifier in accordance with the invention.
FIG. 4 is a schematic diagram of an electronically tunable ultra-high frequency power amplifier in accordance with the invention.
FIG. 5 is a partially broken away, perspective view of another transmission line in accordance with the invention which may be used in the electronically tunable ultra-high frequency power amplifier of FIG. 4.

Referring now to the drawing, and first to FIG. 4. The electronically tunable ultra-high frequency power amplifier of the present invention is there identified generally by the reference number 10. The UHF power amplifier 10 includes a vacuum tube 11 having a control grid 13 which may be electronically and mechanically connected to a casing or outer shield, not shown. The casing or outer shield is at a reference or ground potential so that the vacuum tube 11 is of the conventional grounded grid type; however, it should be recognized that the amplifier 10 of the present invention is not confined for use with grounded grid triode vacuum tubes. Excitation or input signals for the amplifier 10 are supplied to a cathode 14 of the tube 11 at input terminals 15 and 16. The plate 17 of the tube 11 is connected to a junction point 21. A source of DC operating voltage 18, indicated at $B^+$, is connected to the junction point 21 by way of a lead 12, through an RF choke or inductor 19. The lead 12 extends through an RF bypass capacitor 9 which is connected to ground so as to pass radiated energy to ground.

The input signal may be either a wide band pulse signal or a continuous wave signal having a frequency within a predetermined band or range. By way of example the tube 11 may suitably be a planar triode number 2C39A, having an effective inter-electrode capacitance ($C_t$) for grounded grid operation as shown by a capacitor 22 in a phantom view, connected between ground and a junction *21a*.

The electronically tunable UHF power amplifier 10 further includes a load circuit comprising a transmission line such as a triplate transmission line 23 (FIG. 1) having a length equal to one quarter wavelength of the lowest frequency in the band over which the amplifier operates, which in the illustrated case is the UHF band, and having distributed inductance along the length thereof as illustrated schematically by inductors $L_1$, $L_2$, $L_3$ and $L_4$. Although only four inductors $L_1$, $L_2$, $L_3$ and $L_4$ are shown, it should be understood that the transmission line 23 may have more or less distributed inductances. Although a triplate line is illustrated in FIG. 1, the transmission line 23 may be of a strip line, a coaxial type, or of the two-conductor type such as shown in FIG. 5 and will be explained in more detail together with FIGS. 1, 2 and 5.

The transmission line 23, which is of the triplate type (FIGS. 1 and 2), has outer walls 51 of conducting material and a coaxial center conductor 52. The outer walls are short circuited at one end by a conductive plate 53 which is connected to ground. The line's electrical length is determined by the distance from the short circuited end to the open end thereof effectively.

The transmission line 23 is connected at the open or receiving end to a capacitor 24 and the capacitor 22 (the effective inter-electrode capacitance $C_t$ of the tube 11) which is effectively in series therewith. The connection is made to a terminal 25 which is connected to the outer wall 51 and to a terminal 26 which is connected to the grounded center conductor 52. The capacitor 22 is connected between junction 21*a* and ground and transmission line 23 is connected between ground and junction 21*a* to form a parallel or anti-resonant circuit. The de-coupling capacitor 24 is connected between the junction 21*a* and input terminal 25 of the coaxial transmission line 23 to block any DC current to the transmission line 23 from the source of DC voltage 18. The coupling capacitor 24 is relatively large so as to provide a very low AC impedance path to the transmission line 23.

In accordance with the present invention, a plurality of electronic switching means, 27, 28 and 29, such as PIN diodes, type MS–6010 being suitable, are disposed along the length of the transmission line 23 at discrete junction points, namely junction points 31, 32 and 33, which are between inductance $L_1$ and $L_2$, between $L_2$ and $L_3$, and between inductance $L_3$ and $L_4$ respectively. The inductances $L_1$, $L_2$, $L_3$ and $L_4$ are presented by different line portions into which the line is divided by the switching means 27, 28 and 29. The junction points 31, 32 and 33 may, when short circuited by the electronic switching means 27, 28 and 29, define different electrical lengths of the transmission line 23 in accordance with the invention.

PIN diodes, or p-i-n diodes as they are sometimes referred to, are particularly suited for use in the amplifier 10 since the resistance of the PIN diode is variable and may be controlled by a DC bias potential from a bias control circuit 37. PIN diodes are switching diodes comprising $P^+$ type and $N^+$ type regions separated by an intrinsic layer I. The resistance of the PIN diode may be controlled by a DC bias, that is, the PIN diode may be reverse biased to derive a very high impedance in the order of ten thousand ohms, or better, and may be forward biased such that the resistance of the PIN diode is in the range of 1–2 ohms. PIN diodes are particularly advantageous over ordinary diodes in rapid switching applications since they provide low capacitance, high breakdown voltage, a low series resistance and are small in size. Also PIN diodes do not follow instantaneous signal changes at microwave frequencies because minority carrier lifetime is much longer than the microwave signal period. That is, its $R_i$ (resistance of the intrinsic layer) will effectively remain at its biased value despite large excursion of an amplified signal. It should be recognized, however, that other diodes or electronic switching means such as transistors and varactors, which have electronic characteristics similar to PIN diodes, may be employed in the practice of the invention.

The electronic switching means 27, 28 and 29 may include parallel connected PIN diodes 44, 44*a*, 45, 45*a*, and 46, 46*a* respectively, which provide a very low impedance or an effective short circuit to ground through radio frequency bypass capacitors 34, 35 and 36 respectively when forward biased, and provide an effective open circuit or a very high impedance when reverse biased by way of leads 38, 39 and 40.

The electronically tunable ultra-high frequency power amplifier 10 also includes the bias control circuit 37 connected to the electronic switching means 27, 28 and 29 and leads 38, 39 and 40 respectively for selectively biasing the electronic switching means 27, 28 and 29 into and out of their conducting states by forward biasing or backward biasing the electronic switching means 27, 28 and 29. The electronic switching means 27, 28 and 29 may be forward biased, for example, by applying a positive potential on leads 38, 39 and 40 respectively. The electronic switching means 27, 28 and 29 may be reverse biased by applying a negative DC potential on leads 38, 39 and 40. All the electronic switching means 27, 28 and 29 may be reverse biased so that the series inductance $L_1$, $L_2$, $L_3$ and $L_4$ may be connected in parallel with the effective capacitance $C_t$ of the tube (capacitor 22). The parallel or anti-resonant circuit defined by the effective capacitance $C_t$ (capacitor 22) and the series inductances $L_1$, $L_2$, $L_3$ and $L_4$ has a resonant frequency $f_1$ as shown by the following equation:

$$f_1=\frac{1}{2\pi\sqrt{C_t(L_1+L_2+L_3+L_4)}} \quad (1)$$

Where $f_1$ is the resonant frequency;

$C_t$ is the effective capacitance of the tube 11; and $L_1$, $L_2$, $L_3$ and $L_4$ are the total distributed inductance of the transmission line 23.

The anti-resonant curve of Equation 1 is shown by a curve 56 in FIG. 3.

The resonant frequency of the parallel or anti-resonant circuit defined by the effective capacitance $C_t$ and the transmission line 23 may be shifted selectively by forward or reverse biasing the electronic switching means 27, 28 and 29 into and out of their conducting states. For example, when electronic switching means 29 is in a conducting state or is forward biased, inductance $L_1$, $L_2$ and $L_3$ are in series with each other, and the three series inductances $L_1$, $L_2$ and $L_3$ are in parallel with (capacitor 22) the effective capacitance $C_t$ of the tube 11 so that the resonant frequency $f_1$ is now shifted to a new resonant frequency $f_2$ which may be defined as follows:

$$f_2=\frac{1}{2\pi\sqrt{C_t(L_1+L_2+L_3)}} \quad (2)$$

The anti-resonant curve of Equation 2 is shown by a curve 57 in FIG. 3.

It can be seen that if another signal input is applied to input terminals 15 and 16, the output resonant curve is substantially the same as shown in FIG. 3, but the center frequency $f_2$ has shifted by an amount determined by the new electrical length of the transmission line 23.

In a like manner electronic switching means 27 and 28 may be forward or reverse biased into and out of their conduction states to provide a very low impedance to ground to short out inductances $L_3$ and $L_4$ to thereby shorten the electrical length of the coaxial transmission line 23. As the transmission line 23 is electrically shortened by effectively short circuiting the inductance $L_1$, $L_2$, $L_3$ and $L_4$ electronically, the frequency of the parallel or anti-resonant circuit may be step tuned as seen by Equations 1 and 2 and resonant curves 56–59 as shown in FIG. 3.

The output of the power amplifier 10 is taken off junction point 21*a* through a coupling capacitor 30 to an output terminal 41. The output gain characteristic of the power amplifier 10 is shown graphically by curves 56, 57, 58 and 59 in FIG. 3 and will be described in more detail with the operation of the power amplifier 10.

FIGS. 1 and 2 show in greater detail a preferred embodiment of the transmission line 23 and the electronic switching means 27, 28 and 29. The transmission line 23 is of the triplate type partially cut away to show the outer wall 51 and the center conductor 52 and parallel connected PIN diodes 44, 44*a*; 45, 45*a*; 46, 46*a* which are included in the electronic switching means 27, 28 and 29.

Electronic swtching means 27 includes PIN diodes 44 and 44a which are connected in parallel between the center conductor 52 and the bias control circuit 37, by leads 43 and 43a through RF bypass capacitors 34 and 34a. Parallel connected PIN diodes 44 and 44a are employed in the electronic switching means 27 since they provide a short circuit or lower impedance than a single PIN diode when forward biased; however, a single PIN diode may be used as shown in FIG. 5. The electronic switching means 28 includes PIN diodes 45 and 45a which are connected in parallel between the center conductor 52 and bias control circuit 37 by leads 47 and 47a through RF bypass capacitors 35 and 35a. The electronic switching means 29 includes PIN diodes 46 and 46a which are also connected in a similar manner in parallel between the center conductor 52 and the bias control circuit 37 by a lead 48 and 48a through RF bypass capacitors 36 and 36a.

The RF bypass capacitors 34, 34a, 35, 35a, 36 and 36a, shunt RF radiation from the DC bias leads 43, 43a; 47, 47a; 48 and 48a to ground by way of the outer wall 51 of the transmission line 23.

In the operation of the electronically tunable UHF power amplifier 10, the electronic switching means 27, 28 and 29 may be used to effectively short out sections of the inductances $L_1$, $L_2$, $L_3$ and $L_4$ of the transmission line 23 in response to a DC biasing potential from the bias control circuit 37 such that the electronic switching means 27, 28 and 29 have a very high impedance when reverse biased, and a low impedance when forward biased. For example, when the electronic switching means 27, 28 and 29 have a high impedance, the resonant frequency $f_1$ of the parallel or anti-resonant circuit comprising the effective capacitance $C_t$ (capacitor 22) and the series connected inductances $L_1$, $L_2$, $L_3$ and $L_4$, may be determined by Equation 1. The resonant frequency $f_1$ is considered as the lowest frequency since all the inductances $L_1$, $L_2$, $L_3$ and $L_4$ are in series and in parallel with the effective capacitance $C_t$ of the tube 11 since the transmission line is electrically short circuited by the conductor 53 to ground. The impedance of the electronic switching means 27, 28 and 29 when reverse biased is in the order of ten thousand ohms and does not appreciably load the parallel or anti-resonant circuit, since the combined impedance of each of the pair of parallel connected diodes in each of the electronic switching means 27, 28 and 29 is substantially higher than the impedance of the transmission line 23 by several magnitudes.

The curve 56 (FIG. 3) is a gain versus frequency response curve which may be used to describe the instantaneous bandwidth) of the amplifier 10 at frequency $f_1$. FIG. 3 also shows the response curves 57, 58 and 59 at center frequencies $f_2$, $f_3$ and $f_4$.

In accordance wth the invention, the parallel or anti-resonant circuit may be step-tuned selectively by forward biasing the electronic switching means 27, 28 and 29 selectively. For example, the electronic switching means 27 and 28 may be reverse biased while the electronic switching means 29 may be forward biased by the bias control circuit 37. When the electronic switching means 29 is forward biased, the transmission line 23 has a new electrical length which includes only the inductances $L_1$, $L_2$ and $L_3$, which are connected in series with the effective capacitance $C_t$ (capacitor 22) of the tube 11. The parallel or anti-resonant circuit now has a new frequency $f_2$ which is higher than the frequency $f_1$ as shown by Equation 2 and produces a new resonant curve 57 which may instantly partly overlap the band-width curve 56 as defined by the center frequency $f_1$.

The power amplifier 10 may be further step-tuned by forward biasing the electronic switching means 28, such that the transmission line 23 has a new electrical length having inductances $L_1$ and $L_2$ which are in series and in parallel with the effective capacitance $C_t$ (capacitor 22) of the tube 11. The parallel or anti-resonant circuit comprising the series connected inductances $L_1$ and $L_2$ now have a different center frequency $f_3$ which is higher than the center frequencies $f_1$ and $f_2$ and overlap the resonant curve which includes the center frequency $f_2$. Thus, the instantaneous bandwidth of the amplifier has now been step-tuned electronically over center frequencies $f_1$, $f_2$ and $f_3$ as shown by the resonant curves 56–58 in FIG. 3. The instantaneous bandwidth of the amplifier 10 may be still further step-tuned by forward biasing the electronic switching means 27, such that the parallel resonant circuit includes the effective capacitance $C_t$ (capacitor 22) and the inductance $L_1$, which defines a parallel circuit having a resonant frequency $f_4$ which is still higher than the center frequency $f_1$, $f_2$ and $f_3$. Thus, in the operation of the amplifier 10, diode switching may be rapidly effected as often as is necessary to move the center resonant frequency such that the envelope of the amplifier gain characteristics overlap to cover a desired frequency spectrum as shown in FIG. 3. The step tuning is accomplished by selectively forward biasing or reverse biasing the electronic switching means 27, 28 and 29.

One of the requirements for a device to electronically tune circuits employing LC networks such as amplifiers, preselector oscillators, and the like, is that the device has the capability of having its impedance varied from a very high value (several thousand ohms or more) to a very low value (less than one tenth the characteristic impedance of the resonant line) by a bias current or voltage in a relatively short period of time. Such devices are PIN diodes, switching diodes, varactor diodes, transistors and thermistors.

The operation of the amplifier 10 has been described by the use of the electronic switching means 27, 28 and 29, which include the parallel connected PIN diodes 44, 44a; 45, 45a; 46, 46a. It should be recognized that the parallel connected PIN diodes 44, 44a, parallel connected PIN diodes 45 and 45a, and the parallel connected PIN diodes 46 and 46a may be forward biased or reverse biased by the bias control circuit 37 in a manner described above for the electronic switching means 27, 28 and 29.

It should also be understood that the length of the transmission line may represent lengths of distributed capacitance which depends on the electrical length (for a given frequency) of the transmission line 23.

It will also be observed from the foregoing description that since the power amplifier 10 employs a transmission line 23 for the parallel or anti-resonant circuit, it is characterized by very low losses, high stability and very low external radiation, due to the excellent shielding and freedom from parasitic oscillators and the like. The UHF power amplifier 10 may be electronically switched selectively very easily and without resort to tedious, delicate, mechanical adjustments, to provide amplification over a wide frequency range.

FIG. 5 shows another transmission line 61 which may be used in accordance with the invention to derive a desired inductive reactance in the UHF power amplifier 10 of FIG. 4. The transmission line 61 includes two parallel conductors 62 and 63, separated by a dielectric 64. The transmission line 61 has a length which is greater than a quarter wavelength of the highest operating frequency of the amplifier 10. A series of three PIN diodes 65–67 are connected between the two conductors 62 and 63 at discrete points along the length of the transmission line 61. The transmission line 61 has distributed inductances such as $L_1$, $L_2$, $L_3$ and $L_4$ along the length of line between the discrete points, which inductances may be effectively shorted out by PIN diodes 65, 66 and 67 in a manner similar to that employed in the amplifier 10. For this purpose a bias control circuit 68, connected by leads 71, 72, 73 is used to selectively forward bias or reverse bias the PIN diodes 65, 66 and 67 respectively. Thus, the electrical lengths of the transmission line 61 may be selectively switched to predetermine frequencies in the same manner that the electrical length of the transmission line 23 was varied. The transmission line 61 may be connected across the capacitor 22 at terminals 69 and 70 in a manner similar to the transmission line 23 in the amplifier 10 of FIG. 4.

Although only two transmission lines, namely transmission lines 23 and 61, have been shown, and their distributed inductance has been utilized in the parallel or anti-resonant circuit, it should be understood that other transmission lines may be used and a distributed capacitance of the transmission line may also be used when necessary in accordance with the invention.

The transmission line 61 is inductive when it is a quarter wavelength or less at the operating frequency and is shorted at one end which is opposite to the open or input end. The transmission line 61 is also inductive when it is a half wavelength or less and is open circuited at the end. The transmission line 61 is capacitive when it is a quarter wavelength or less at the operating frequency and is open circuited at the one end. The transmission line is also capacitive when it is a half wavelength and is short circuited at the one end. Thus, in accordance with the invention the transmission line 61 may consititute the inductance or capacitance of a network or circuit and the value of the inductance or capacitance may be selectively changed electronically by a series of PIN diodes biased along the length of the transmission line.

While specific embodiments of the invention have been described and shown, these may be considered illustrative. Still further modifications will undoubtedly occur to those skilled in the art. Therefore, the foregoing description is to be considered as illustrative and not in any limiting sense.

What is claimed is:

1. An electronically tunable network for high frequency signals comprising
   (a) a plurality of spaced electrically conductive members which support the propagation of high frequency signals through the space therebetween,
   (b) a plurality of PIN diodes extending laterally between said members, said diodes being spaced from each other longitudinally along said conductors,
   (c) at least one of said members having openings through which at least one end of each of said plurality of diodes extend,
   (d) ohmic connections between the other member and the opposite end of each of said diodes, and
   (e) a bias control circuit connected to each of said diodes through said openings altering the biased relationship of said diodes from a reversed to a forward biased relationship thereby changing the tuning of said network.

2. The invention as set forth in claim 1 including
   (a) coupling means for applying said high frequency signals to one end of said network including high frequency current carrying means connected to one of said members at one end thereof, and
   (b) a conductive member connecting said members at a predetermined distance from said one end and extending across the space therebetween.

3. The invention as set forth in claim 2 wherein said high frequency current carrying means is a capacitor and wherein said distance is greater than a quarter wavelength, but less than a half wavelength of the frequency of said high frequency signals.

4. The invention as set forth in claim 3 including an amplifying device for said high frequency signals, said device having an output circuit including two terminals, one of said terminals being connected to said capacitor and the other to said other member.

5. The invention as set forth in claim 1 wherein said openings are occupied by bypass capacitors.

6. The invention as set forth in claim 1 wherein said one member and said other member are first and second members of a transmission line, said line including a third member spaced from said second member, a second plurality of PIN diodes disposed in mirror image relationship to said first mentioned plurality of PIN diodes between said third member and said second member, said third member having openings for one end of each of said second plurality of PIN diodes, and means connecting said bias control circuit to said second plurality of PIN diodes so that each pair of diodes in both pluralities which are in mirror image relationship are conditioned simultaneously into forward biased and reverse biased relationship.

7. The invention as set forth in claim 1 including a slab of dielectric material, said members being disposed on opposite sides of said slab to define a stripline, said slab having openings for said PIN diodes.

References Cited

UNITED STATES PATENTS

| | | | |
|---|---|---|---|
| 2,159,782 | 5/1939 | Coaklin et al. | 334—41 X |
| 2,438,116 | 3/1948 | Dodds et al. | 325—172 |
| 3,155,914 | 11/1964 | Vice et al. | 325—445 X |
| 3,155,922 | 11/1964 | Hackett | 331—181 X |
| 3,264,566 | 8/1966 | Kaufman et al. | 325—465 |
| 3,319,168 | 5/1967 | Olson | 325—172 |

NATHAN KAUFMAN, *Primary Examiner.*